United States Patent
Chan et al.

(10) Patent No.: US 8,993,366 B2
(45) Date of Patent: Mar. 31, 2015

(54) HIGH EFFICIENCY, LIGHTWEIGHT, FLEXIBLE SOLAR SHEETS

(71) Applicant: MicroLink Devices, Inc., Niles, IL (US)

(72) Inventors: Raymond Chan, Hoffman Estates, IL (US); Haruki Miyamoto, Schaumburg, IL (US)

(73) Assignee: MicroLink Devices, Inc., Niles, IL (US)

( * ) Notice: Subject to any disclaimer, the term of this patent is extended or adjusted under 35 U.S.C. 154(b) by 0 days.

(21) Appl. No.: 13/931,463

(22) Filed: Jun. 28, 2013

(65) Prior Publication Data
US 2014/0004645 A1    Jan. 2, 2014

Related U.S. Application Data

(60) Provisional application No. 61/665,572, filed on Jun. 28, 2012.

(51) Int. Cl.
| | | |
|---|---|---|
| H01L 21/00 | (2006.01) | |
| H01L 31/18 | (2006.01) | |
| H01L 31/05 | (2014.01) | |

(52) U.S. Cl.
CPC ........ H01L 31/1876 (2013.01); H01L 31/0508 (2013.01); *Y02E 10/50* (2013.01)
USPC .............. 438/67; 257/E27.124; 257/E27.125; 257/E27.126; 257/E25.007; 257/E25.009

(58) Field of Classification Search
USPC ....................... 438/57, 67; 257/E27.124–126, 257/E25.007, E25.009
See application file for complete search history.

(56) References Cited

U.S. PATENT DOCUMENTS

| | | | |
|---|---|---|---|
| 8,440,492 B2 * | 5/2013 | Chan et al. ...................... | 438/67 |
| 2005/0126622 A1 * | 6/2005 | Mukai et al. ................... | 136/251 |

(Continued)

OTHER PUBLICATIONS

Nowlan, Mike. "Lamination Key to Module Reliability." RenewableEnergyWorld.com, Oct. 29, 2010. http://www.renewableenergyworld.com/rea/news/article/2010/10/lamination-key-to-module-reliability.*

(Continued)

*Primary Examiner* — Evan Pert
*Assistant Examiner* — Gustavo Ramallo
(74) *Attorney, Agent, or Firm* — Nelson Mullins Riley Scarborough LLP; Anthony A. Laurentano

(57) ABSTRACT

The method of the invention includes the sequential steps of providing a plurality of solar cells, interconnecting the solar cells using one or more interconnect tabs, attaching the interconnect tabs to a top side of the solar cell to interconnect the plurality of solar cells by coupling an exposed top surface of a first solar cell to a top surface of an adjacent second solar cell, attaching one or more bypass diodes to a top side of the solar cell, then next applying an adhesive to a first film layer, placing the plurality of solar cells onto the first film layer, then next applying an adhesive to a second film layer, placing the plurality of solar cells and first film layer onto the second film layer to form a sheet assembly, and then forming the solar sheet from the sheet assembly.

11 Claims, 12 Drawing Sheets

(56) References Cited

U.S. PATENT DOCUMENTS

| | | | |
|---|---|---|---|
| 2005/0178428 A1* | 8/2005 | Laaly et al. | 136/251 |
| 2005/0268962 A1* | 12/2005 | Gaudiana et al. | 136/255 |
| 2007/0193622 A1* | 8/2007 | Sai | 136/252 |
| 2008/0135083 A1* | 6/2008 | Lai et al. | 136/244 |
| 2008/0185035 A1 | 8/2008 | Hayes | |
| 2010/0275969 A1 | 11/2010 | Chan et al. | |
| 2011/0127567 A1 | 6/2011 | Seong | |
| 2012/0000510 A1 | 1/2012 | Wiedeman et al. | |
| 2014/0004645 A1* | 1/2014 | Chan et al. | 438/59 |

OTHER PUBLICATIONS

Eguchi et al., "Influence of Ionomer/Carbon Ratio on the Performance of a Polymer Electrolyte Fuel Cell." Nov. 20, 2012. Mdpi Journal: Polymers.*

International Search Report and Written Opinion for Application No. PCT/US13/48728, 7 pages, dated Dec. 3, 2013.

* cited by examiner

HIGH EFFICIENCY, LIGHTWEIGHT, FLEXIBLE SOLAR SHEETS

RELATED APPLICATION

This application claims priority to Provisional patent application Ser. No. 61/665,572, filed on Jun. 28, 2012, the contents of which are hereby incorporated by reference.

BACKGROUND OF THE INVENTION

With a growing interest in renewable energy including the use of solar power, there is an increasing demand for more efficient solar cells. Solar cells or photovoltaic (PV) cells are devices that convert solar or light energy into electricity by the photovoltaic effect, and solar cells are widely used in devices ranging from satellites and other applications, including portable consumer electronic devices that are remote from a conventional power source, aircraft and terrestrial vehicles. Although the term "solar cell device" may sometimes be used to refer to a device that captures energy from sunlight, the terms "solar cell device" and "photovoltaic device" are interchangeably used in the present application regardless of the light source.

Solar cells or photovoltaic devices (PV devices) convert sunlight directly into electricity and generally are made of semiconducting materials similar to those used in computer chips. When sunlight is absorbed by these materials, the solar energy frees electrons loose from their atoms, which allows the electrons to flow through the material to produce electricity. The process of converting light (i.e., photons) to electricity is called the photovoltaic (PV) effect. In practice, solar cells are typically combined into modules that hold numerous cells (e.g., up to 40 or more cells), and a set of these modules (e.g., up to 10 or more) are mounted in PV arrays or solar panels that can measure up to several meters or more per side, with each cell typically only being up to 100 to 150 square centimeters in size. These flat-plate PV arrays can typically be mounted at a fixed angle facing the Sun (e.g., south) or they may be mounted on a tracking device that follows the position of the Sun to allow them to better capture the Sun's light throughout the day. Solar cells may also be formed using thin film technologies to use layers of semiconductor materials that are only a few micrometers thick.

Currently, III-V compound based photovoltaic devices are epitaxially grown on substrates and remain affixed thereto throughout fabrication and deployment as a solar cell. In many cases, the substrates can be approximately 150 µm thick. Having substrates with such thickness may introduce a number of undesirable consequences for a solar cell.

One such undesirable consequence is weight. The thick substrate can make up a large percentage of the overall weight of the resulting solar cell. In certain applications, such as space applications, weight and size of a solar cell can be significant given the liftoff capability of the selected launch vehicle.

Another undesirable consequence is poor thermal conductivity. The substrate increases the thermal impedance between the solar cell and a heat sink on which the substrate and solar cell may be mounted. The increased thermal impedance results in higher junction temperatures in the solar cell, which, in turn, reduces the efficiency of the solar cell.

Another undesirable consequence is environmental impact. The substrate serves no purpose other than as a mechanical support for the solar cell. In addition, to achieve a substrate thickness of approximately 150 µm, it is typically necessary to remove, mechanically or chemically, part of the substrate, which amounts to further waste.

Another undesirable consequence is lack of flexibility. A 150 µm thick substrate is rigid, which means that the solar cell cannot be mounted on a curved surface and cannot be rolled up for easy storage, thus limiting their potential applications.

Although, it is desirable that the substrate of a solar cell be as thin as possible to reduce the weight and to increase the thermal conductivity, thin substrates can also present undesirable difficulties. If the substrate is too thin, the III-V compound solar cell can become so fragile that it is very difficult to handle. For example, a layer of Gallium Arsenide (GaAs) that is 100 mm in diameter, but only 2-10 µm thick, tends to crack and break when subjected to even very gentle handling. This consideration applies particularly to whole wafers of III-V compound solar cells. That is, the thinner the substrate, the more difficult it becomes to fabricate whole wafers of III-V compound solar cells without a decrease in yield due to breakage and handling damage.

Accordingly, a thin film III-V compound solar cell and methodologies for fabrication of thin film III-V compound solar cells that are highly-efficient, flexible, and formed as sheets (such as solar sheets) are highly desirable.

Solar sheets offer a convenient and effective method of generating electrical power for space, airborne, and terrestrial applications. The problem, however, with conventional solar sheets is that they are typically heavy, inefficient, and bulky. Moreover, conventional solar sheets have a low specific power (power generating capacity per unit mass), low areal power (power generating capacity per unit area), and high areal mass density (mass per unit area).

SUMMARY OF THE INVENTION

The present invention is a solution to the problem of weight, efficiency, and bulk issues posed by conventional solar sheets, thereby making them more suitable for existing applications and enabling new applications.

The present invention concerns high-efficiency, lightweight, flexible solar sheets containing epitaxial lift-off (ELO) triple-junction, inverted metamorphic (IMM) solar cells and methods of making the solar sheets. The physical properties of the sheet make it very attractive for a number of applications, such as space and terrestrial applications.

The method of the present invention is directed towards forming a solar sheet having an array of solar cells. The method includes the sequential steps of providing a plurality of solar cells, then next interconnecting the plurality of solar cells using one or more interconnect tabs by coupling an exposed top surface of a backmetal layer of a first solar cell to a top surface of an adjacent second solar cell, then next attaching the interconnect tabs to the top side of the solar cell to interconnect the plurality of solar cells by coupling the exposed top surface of the backmetal layer of a first solar cell to a top surface of an adjacent second solar cell, attaching one or more bypass diodes to a top side of the solar cell, then next applying an adhesive to a first film layer, placing the plurality of solar cells onto the first film layer, then next applying an adhesive to a second film layer, placing the plurality of solar cells and first film layer onto the second film layer to form a sheet assembly, and then forming the solar sheet from the sheet assembly.

The adhesive can comprise a pressure sensitive adhesive or a heat sensitive adhesive. When the adhesive is a pressure sensitive adhesive, the adhesive can be comprise a silicon based material. As such, the step of forming can further comprise placing the sheet assembly in a pressure lamination module to form the solar sheet.

When the adhesive is a heat sensitive adhesive, such as a ethylene vinyl acetate material, then the step of forming further comprises placing the sheet assembly in a heat vacuum lamination module to form the solar sheet.

According to another embodiment of the invention, a method is providing for forming a solar sheet having an array of solar cells. The method comprises the sequential steps of providing a plurality of solar cells, then next interconnecting the plurality of solar cells using one or more interconnect tabs by coupling an exposed top surface of a backmetal layer of a first solar cell to a top surface of an adjacent second solar cell, then next attaching the one or more interconnect tabs to the top side of the solar cell to interconnect the plurality of solar cells by coupling the exposed top surface of the backmetal layer of a first solar cell to a top surface of an adjacent second solar cell, attaching one or more bypass diodes to a top side of the solar cell; then next applying a first film layer to the solar cells, then next applying a second film layer to form a sheet assembly, and then forming the solar sheet from the sheet assembly. At least the first film layer can be formed from a heat sensitive adhesive, such as an ionomer material. The step of forming further comprises placing the sheet assembly in a heat vacuum lamination module to form the solar sheet.

BRIEF DESCRIPTION OF THE FIGURES

These and other characteristics of the present invention will be more fully understood by reference to the following detailed description in conjunction with the attached drawings, in which.

DETAILED DESCRIPTION

Figure 1:
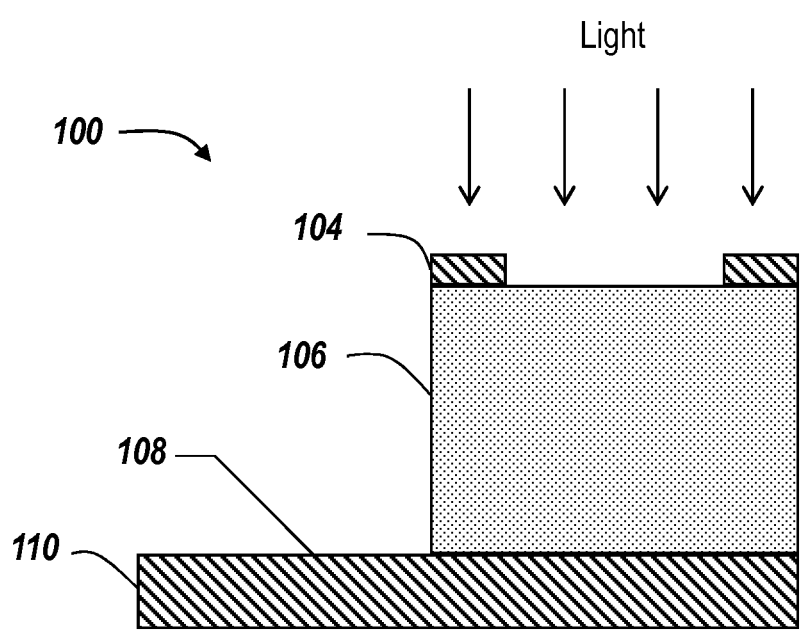
FIG. 1 is a cross-sectional of an exemplary solar cell with etched opening to expose the backmetal layer according to the teachings of the present invention.

The present invention discloses the fabrication and use in solar sheets of thin film III-V compound solar cells. The thin film III-V compound solar cells as taught herein are free of a substrate once fabrication is complete. During fabrication an epitaxial lift-off (ELO) method is used which allows a thin film III-V compound solar cell to be separated from the substrate. A metallized layer, polymer layer, or metal/polymer layer formed on a surface of an active layer of the thin film III-V compound solar cell provides structural support in the absence of the substrate. The resulting thin film III-V compound solar cell is thinner, lighter, and more flexible than substrate supported solar cell devices (i.e., conventional solar cells) allowing for relatively larger sizes to be formed, such as wafer scale components and wafer scale lift-off of thin film III-V compound solar cells. In addition, after separation from the photovoltaic device, the substrate can be reused with appropriate repolishing to restore the surface condition in the fabrication of another thin film III-V compound solar cell device. A suitable ELO method for manufacturing or fabricating solar cells is described for example, in U.S. Pat. No. 7,994,419, assigned to the assignee hereof, the contents of which are herein incorporated by reference.

The present invention relates to a solar sheet that is lightweight and flexible, with state-of-the-art conversion efficiency, specific power, areal power, and areal mass density.

The solar cells that are used to construct the solar sheet are large-area, epitaxial lift-off (ELO), inverted metamorphic (IMM) devices, which are inherently thin, flexible, and mechanically robust. Triple-junction ELO solar cells having an area for example of about 20 cm$^2$ were used in this instance.

Those of ordinary skill in the art will readily recognize that inverted metamorphic multi-junction solar cell devices represent a current class of solar cells having specific advantages in performance, engineering design, operation and cost. IMM devices employ a different way of constructing solar cells. According to conventional techniques, solar cells include multi-layer structures of semiconducting materials with similar crystalline structure. Their performance and cost effectiveness is constrained by growing the cells in an upright configuration. The basic concept of fabricating an inverted metamorphic multijunction (IMM) solar cell device is to grow the subcells of the solar cell on a substrate in a "reverse" sequence. Specifically, high band gap subcells which normally comprise the "top" subcells facing the solar radiation are grown epitaxially on a semiconductor growth substrate. One or more lower band gap middle subcells can then be grown on the high band gap subcells. At least one lower subcell is then formed over the middle subcell such that the at least one lower subcell is substantially lattice-mismatched with respect to the growth substrate and such that the lower subcell has a third lower band gap. In IMM devices, since the cell is grown upside down and employ device layers that use high-energy materials, the result is an ultra-lightweight and flexible solar cell that converts solar energy with relatively high efficiency. An example of an IMM device is described in U.S. Pat. No. 7,741,146, assigned to Emcore, the contents of which are herein incorporated by reference.

According to an exemplary embodiment of the present invention, a plurality of the solar cells may be laid out to form a solar cell array. Those of ordinary skill will readily recognize that any number of solar cells can be present in the solar cell array, and can be arranged in any suitable number of perpendicularly arranged rows. Interconnections between adjacent solar cells and bypass diodes may be attached or connected to the plurality of solar cells only from one surface of the solar cell array, e.g. from the top side or surface of the solar cell array. Once the interconnections and bypass diodes are placed and secured to the solar cells, a top sheet material may be laid across the solar cell assembly and secured in place.

As used herein, a top surface of the solar cell is the surface of the solar cell that faces, i.e. is directly exposed to, incoming light. As used herein, a bottom surface is the surface of the solar cell disposed opposite to the top surface. The bottom surface typically faces away or is not directly exposed to the light.

The assembly technique of the present invention requires the solar cells in the array to have a certain form. That is, semiconductor material in areas where interconnect tabs are to make contact with the backmetal of the solar cell are etched to expose a portion of the top surface of the backmetal layer as illustrated in FIG. 1. An epitaxial liftoff (ELO) methodology as mentioned above may be used to facilitate removing the semiconductor material to expose the backmetal layer according to various embodiments of the present invention. The ELO methodology involves removing or lifting epitaxial layers that form the solar cell device with an attached metal back layer from a substrate with the aid of a release layer. Once released, standard semiconductor fabrication processes can then be performed to etch portions of the epitaxial layers thereby exposing the backmetal. This etching process can be performed using chemical wet or dry etching processes since the epitaxial layers are relatively thin in the ELO approach. For conventional solar cells grown on bulk substrate materials such as Germanium, the removal of the active semiconductor material in order to expose the conductive back layer is more challenging because the active semiconductor layer stack is much thicker compared to the ELO approach.

An exemplary solar cell 100 formed according to teachings of the present application is illustrated in FIG. 1. The exemplary solar cell 100 includes a semiconductor layer 106 formed on top of a backmetal layer 110. A plurality of grid lines 104 may be formed on a top surface of the semiconductor layer 108. A portion of the semiconductor layer 106 is etched to expose a top surface of the backmetal layer 110. As a result, the backmetal layer 110 of the exemplary solar cell 100 according to various embodiments of the present invention includes an exposed etched surface 108.

According to the teachings of the present invention, the illustrated solar cell can have any number of active layers or regions, thus forming for example a single junction, dual junction or triple junction solar cell, or a solar cell having even a greater number of active layers. As used herein, the term "active layer" refers to a layer or region of a thin film III-V compound solar cell having a certain band gap energy characteristic, which uses a certain portion of the solar spectrum to generate electricity. As used herein, each active layer in a multiple junction solar cell device can have a different band gap energy characteristic. According to a preferred embodiment, the solar cell 100 is an inverted metamorphic multijunction (IMM) solar cell device.

As illustrated in FIG. 1, the solar cell 100 formed according to the teachings of the present invention includes a top surface that faces the light. The solar cell 100 includes a back surface that faces away from the light. Specifically, the top surface of the solar cell is the top surface of the semiconductor layer 106 that faces the light. The bottom surface of the solar cell is the bottom surface of the backmetal layer 110 that faces away from the light. The bottom surface of the solar cell 100 is opposite to the top surface of the solar cell 100. The solar cell also includes an exposed etched surface that exposes a top surface of the backmetal layer 108 of the solar cell 100. The top surface of the backmetal layer 108 of the solar cell 100 is disposed opposite to the bottom surface of the backmetal layer 108 of the solar cell 100. That is, the top surface of the backmetal layer of the solar cell is adjacent to and in direct physical contact with the bottom surface of the semiconductor layer 106 of the solar cell 100.

A plurality of adjacent solar cells 100 with exposed etched surfaces 108 may be electrically connected in series and/or in parallel to form a solar cell array. All connections, including diode connections and interconnections between adjacent solar cells may be made solely from one surface of the solar cell array as shown in FIGS. 2A-2D. The assembly method described herein eliminates connecting interconnect tabs and by-pass diodes to the front and back surface of adjacent solar cells as depicted in FIGS. 2A-2D in accordance with the conventional assembly techniques.

As illustrated in FIGS. 2A-2D, interconnect tabs 206 electrically bridge adjacent solar cells 100 in series or in parallel by connecting the top surface, e.g. a top grid line, of a first solar cell to the top surface of the backmetal layer of a second adjacent solar cell.

Figure 2A:
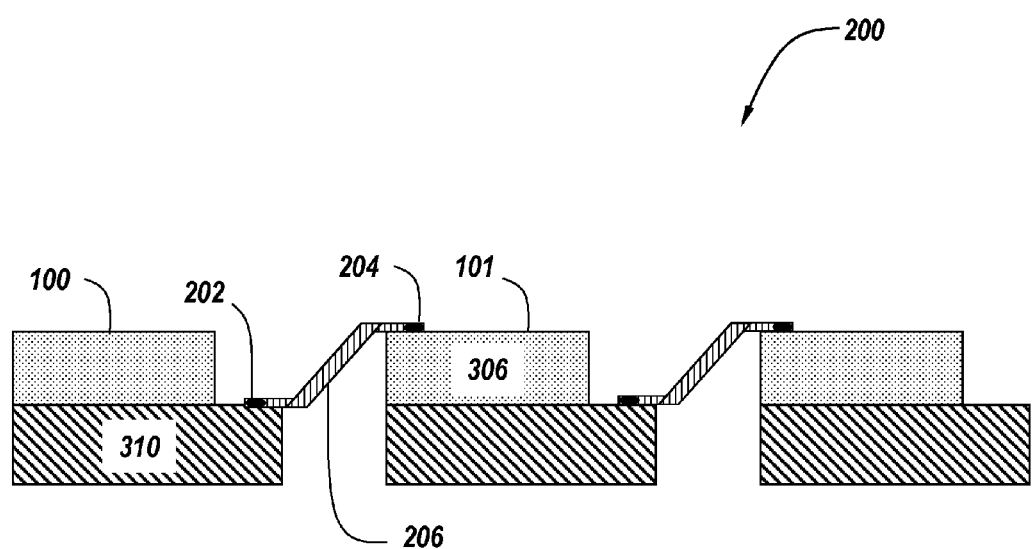
FIG. 2A is a side view of an exemplary solar cell array connected using the top connect interconnect scheme in accordance with the teachings of the present application.

FIG. 2A is a side view of an exemplary solar cell array 200 connected using the interconnect scheme in accordance with the teachings of the present application. As illustrated in FIG. 2A, adjacent solar cells 100 and 101 may be connected by forming a top or front connection 202 on the exposed etched surface 108 formed on the backmetal layer 110 of a first solar cell 100 and by forming another top connection 204 on the top surface of the semiconductor layer 106 of an adjacent second solar cell 101. As such, the interconnect tab 206 is connected to the top surface of the backmetal layer 110 of the first solar cell 100 and to the top surface of the semiconductor layer 106 of the adjacent solar cell 101.

Figure 2B:
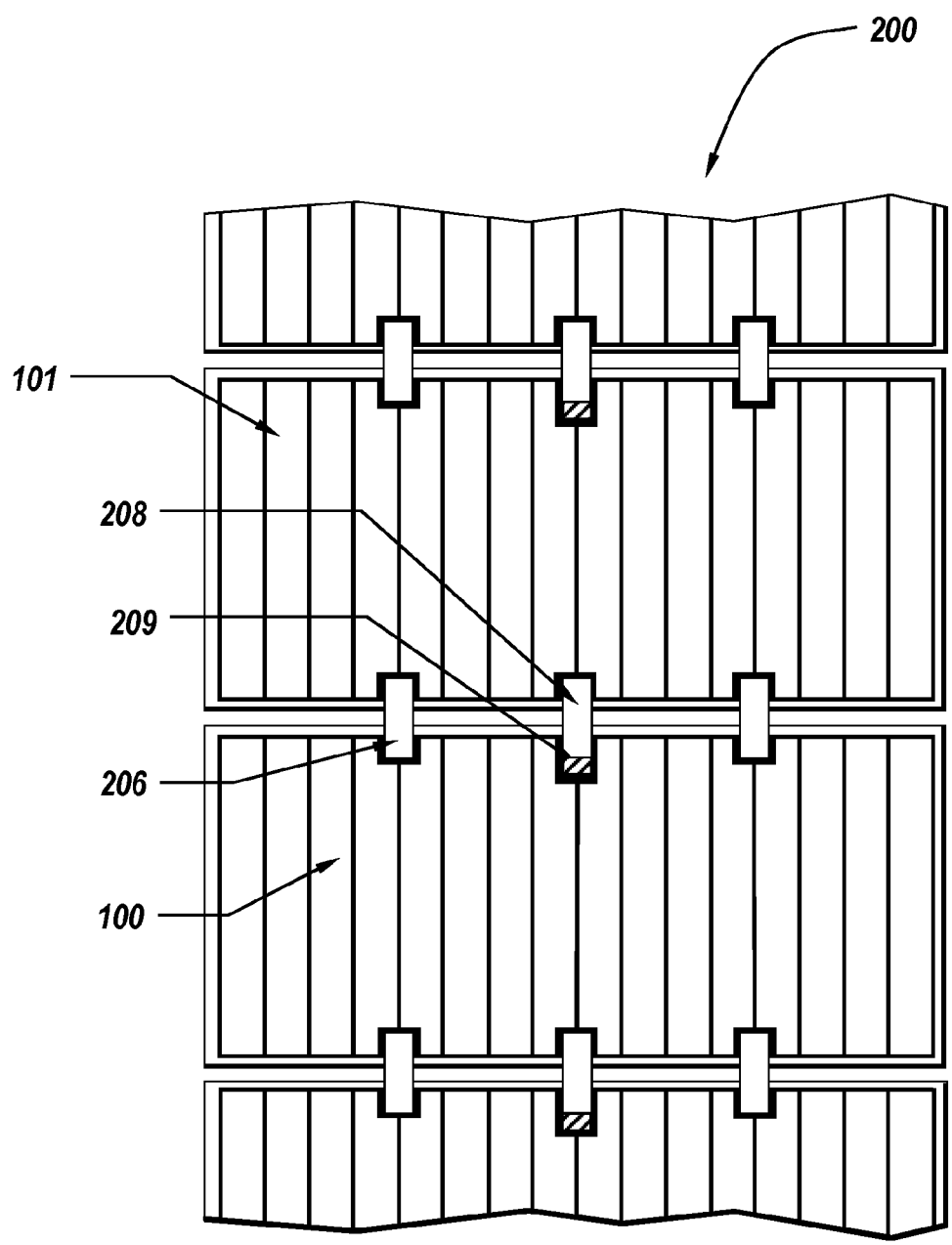
FIG. 2B is a top view of the exemplary solar cell array illustrated in FIG. 2A.
Figure 2C:
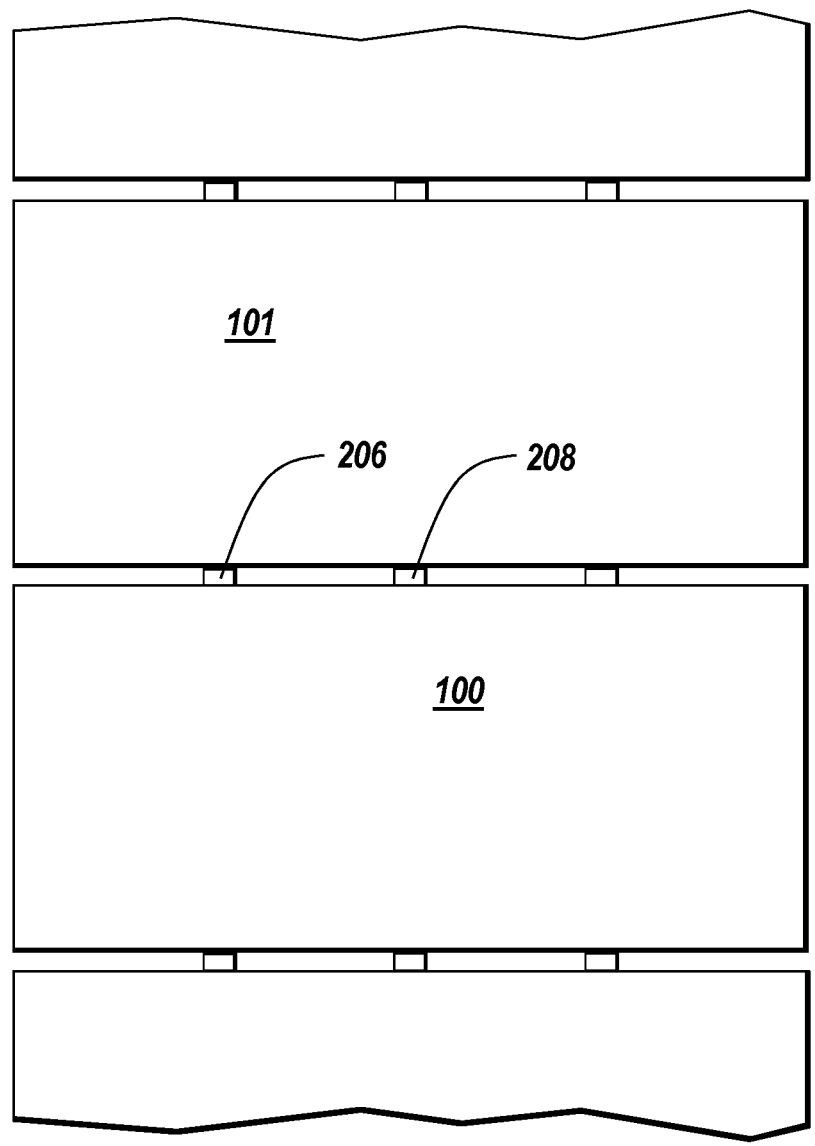
FIG. 2C is a bottom view of the exemplary solar cell array illustrated in FIG. 2A.

FIG. 2B is a top view of the exemplary solar cell array 200 illustrated in FIG. 2A. FIG. 2C is a bottom view of the exemplary solar cell array 200 illustrated in FIG. 2A. FIGS. 2B-2C illustrate a diode 209 attached to the etched surface 108 of the backmetal layer from top front surface of the solar cell 100. One surface of the diode 209 is connected to the backmetal through an etched opening in the epitaxial solar cell material. The opposite surface of the diode 209 is attached to a bypass diode tab 208 that is in turn connected to the top surface of the adjacent second solar cell 101 to form the bypass connection. This connection scheme is effectively able to bypass the first solar cell 100 when necessary without the need for wrap around bypass diode tabs as seen in conventional solar cells. The flexibility of this approach also allows adjacent solar cells to be formed into either serial or parallel arrays to support either higher voltage or higher current applications, as required.

Figure 2D:
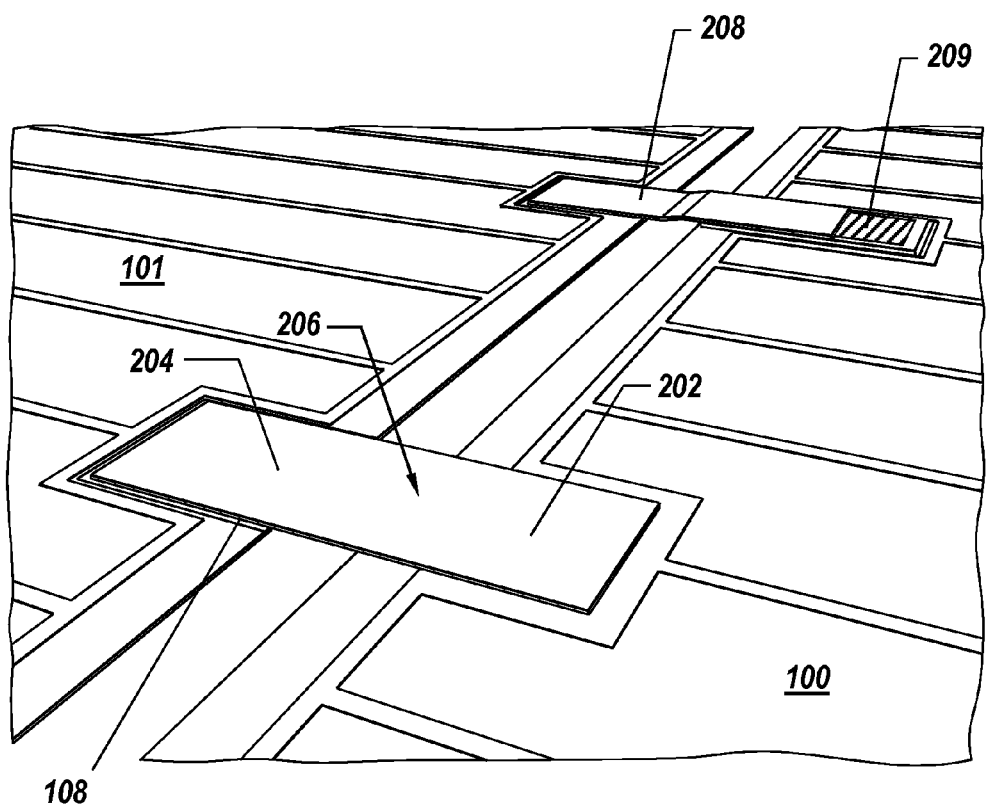
FIG. 2D is a side view close-up of an exemplary interconnect tab used in connection with the exemplary solar cell array according to an exemplary embodiment of the present invention.

FIG. 2D is a side view close-up of an exemplary interconnect tab 206 and a bypass diode tab 208 used in connection with the exemplary solar cell array according to an exemplary embodiment of the present invention. As illustrated in FIG. 2D, the interconnect tab 206 is connected to the top surface of the first solar cell 100 via the top connection 202. The interconnect tab 206 is also connected to the top surface of the adjacent solar cell 101 via the top connection 204. Specifically, the interconnect tab 206 is connected to the exposed etched surface 108 formed on the top surface of the backmetal layer 110 of the adjacent solar cell 101. As further illustrated in FIG. 2D, the bypass diode tab 208 is connected to the bypass diode 209 provided on the top surface of the solar cell 100. The bypass diode tab 208 is also connected to the top surface of the adjacent solar cell 101. The bypass diode tab 208 is connected to an exposed etched surface 108 of the adjacent solar cell 101.

As noted above, the solar cell assembly technique described herein may be used with a plurality of solar cell types, including but not limited to, single junction solar cells, dual junction solar cells, and multi-junction solar cells such as inverted metamorphic multi-junction (IMM) solar cells, or other well known types of solar cells.

Figure 3:
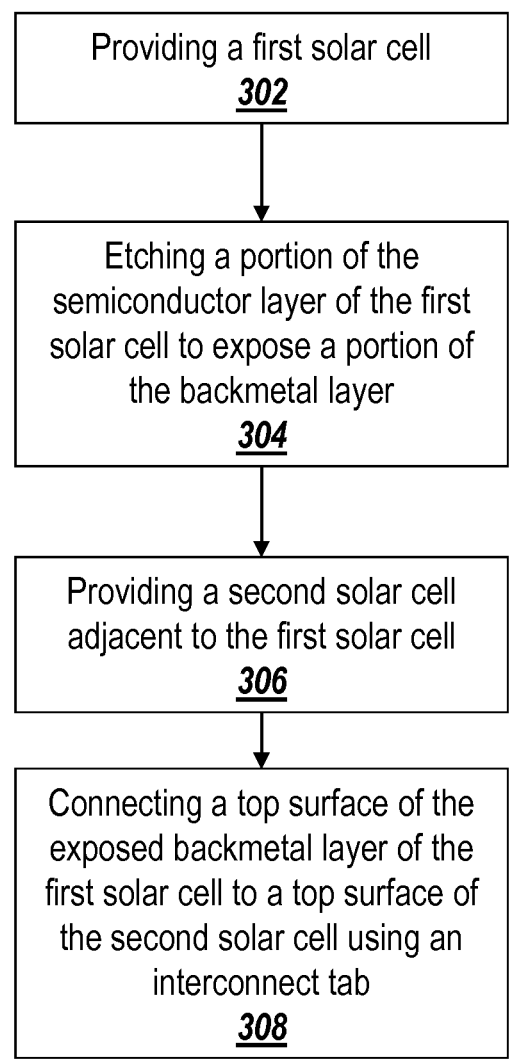
FIG. 3 is a schematic flow chart diagram depicting the steps for assembling a solar cell array using the interconnect scheme according to the teachings of the present application.

FIG. 3 is a flowchart 300 depicting the steps involved in forming solar cell arrays according to the various embodiments of the present application. The method of the present invention includes providing a first solar cell (step 302). The first solar cell can be for example an inverted metamorphic solar cell including a semiconductor layer provided on top of a backmetal layer. A portion of the semiconductor layer of the first solar cell is etched as explained above to expose a portion of the top surface of the backmetal layer (step 304). A second solar cell is provided adjacent to the first solar cell (step 306). The second solar cell is also an inverted metamorphic solar cell and is formed according to the teachings of the present application to include an exposed etched backmetal surface. If the second solar cell is not connected to another solar cell other than the first solar cell, the second solar cell does not need to have an exposed etched surface. The top surface of the exposed backmetal layer of the first solar cell is connected to the top surface of the second solar cell using an interconnect tab (step 308). The top surface of the second solar cell may include one or more grid lines. The top surface of the exposed backmetal layer of the first solar cell may be connected to a grid line provided on the top surface of the second solar cell. This process may be repeated with third, fourth and subsequent solar cells to form a solar cell array.

According to one embodiment of the present invention, as illustrated in FIGS. 2A-2D, an array of top connected inverted metamorphic solar cells can be connected using topside-only contacts. A significant advantage of employing ELO solar cells is that the epitaxial stack in selected areas of the cell may be removed to expose the underlying back metal. This approach allows all electrical interconnections to be made from just the front side of the array, thereby simplifying the array assembly process.

The solar cells of the present invention can be, for example, connected in two strings to form a solar cell array. Each of the strings for example can have eight cells connected in series. The two strings of solar cells are connected in parallel. The electrical connections are made by resistance-welding an interconnect tab composed of a suitable metal, such as silver, directly to the exposed back metal and to the top surface metallization of the cell. Those of ordinary skill in the art will readily recognize that any suitable number and arrangement of solar cells can be employed when forming the solar cell array.

Figure 4:
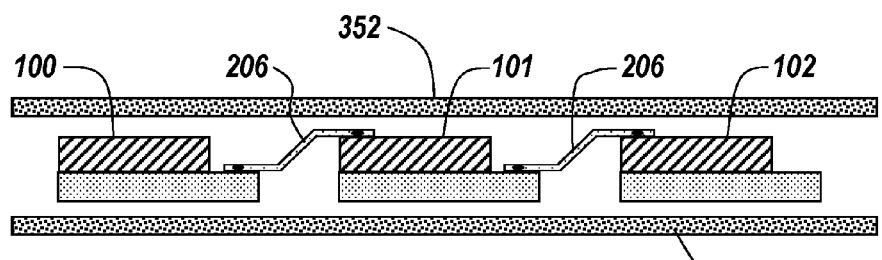
FIG. 4 is a schematic exploded side view of a portion of a solar cell array constructed according to the teachings of the present invention.
Figure 5A:
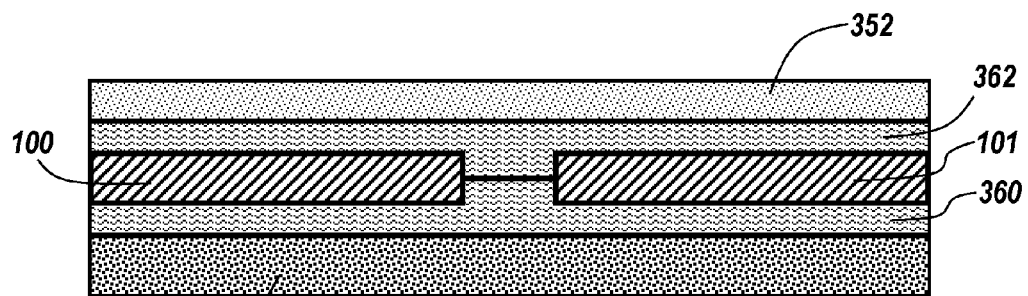
FIG. 5A is a cross-sectional view of the solar cell of FIG. 4 when assembled showing the use of adhesive when forming the solar sheet.
Figure 5B:
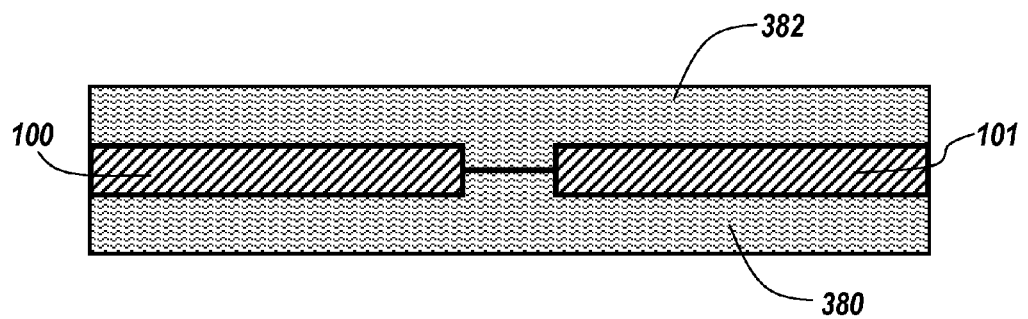
FIG. 5B is a cross-sectional view of the solar cell of FIG. 4 when assembled showing the use of a material that secures the sheet together while concomitantly forming the top and/or bottom sheets.

The interconnected solar cell array can then be encapsulated to form a flexible, highly efficient solar sheet. As illustrated in FIGS. 4, 5A and 5B, the inverted metamorphic solar cells 100, 101, 102, which form part of a solar cell array, are electrically coupled together by a series of corresponding electrical interconnects 206. As shown in FIG. 5A, the interconnected solar cell array can then be placed between a pair of opposed sheets 350 and 352, and an adhesive 360 is applied in order to secure the various components together. Specifically, the solar cell array can have an adhesive applied thereto and then can be sandwiched between a bottom sheet 350 and a top sheet 352. The sheets are preferably thin, flexible sheets of a suitable polymer material. The top polymer sheet 352, which is placed above the cell array, has a high optical transmissivity so as to maximize the amount of light incident on the solar cells in the solar cell array. Examples of material suitable for use as a top sheet, include without limitation, a fluoropolymer (such as Tefzel®), a polyvinyl fluoride material (such as Tedlar®), and preferably polytetrafluoroethylene (such as Teflon®). The bottom polymer sheet 350, which is placed below the cell array, does not need to be transparent, but should be mechanically robust in order to support the completed cell array. Examples of material suitable for the bottom sheet include, without limitation, a polytetrafluoroethylene material (such as Teflon®), a fluoropolymer (such as Tefzel®), a polyimide material (such as Kapton®), and preferably a polyvinyl fluoride material (such as Tedlar).

Figure 6A:
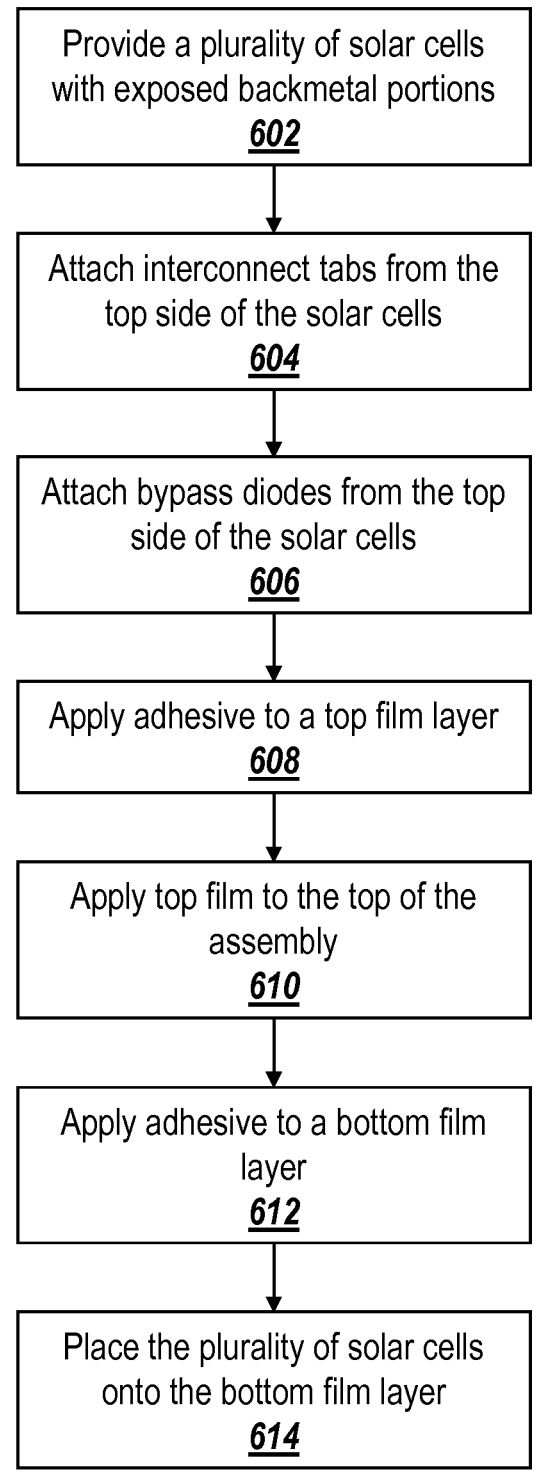
FIG. 6A is a schematic flow chart diagram depicting the sequential steps for forming an array of solar cells according to one embodiment of the present invention.

FIG. 6A illustrates a flowchart describing the sequential steps for forming a solar cell assembly using the connection method according to the teachings of the present invention. According to the current method, a plurality of inverted metamorphic solar cells with exposed backmetal portions are provided (step 602). The interconnect tabs 206 are then attached to the solar cells from the top side of the solar cells (step 604). The interconnect tabs 206 are then attached to the solar cells by welding or any other appropriate fixation method. Next, the bypass diodes are attached and/or connected to the solar cells from the top side of the solar cells (step 606). The bypass diodes can also be attached to the solar cells by welding or any other appropriate fixation method. An adhesive 362 is then applied to a top film layer 352 (step 608), and the film and adhesive are then applied or laminated to the current solar cell assembly (step 610), FIG. 5A. Likewise, the adhesive 360 is applied to a bottom film layer 350 (step 612) and then the plurality of solar cells are placed on the film layer (step 614).

An adhesive layer was used to bond the solar sheet stack together. The adhesive can be either a pressure sensitive adhesive or a heat sensitive adhesive. If the adhesive is a pressure sensitive adhesive, then the adhesive is preferably a silicone-based pressure sensitive adhesive having a high optical transmissivity. Other adhesives with the correct optical and adhesion properties can also be used. If the adhesive is a heat sensitive adhesive, then the adhesive is preferably a copolymer, such as ethylene vinyl acetate (also known as EVA) or a polymer such as an ionomer, both types of which preferably have a high optical transmissivity. Other adhesives with the correct optical and adhesion properties can also be used.

Figure 6B:
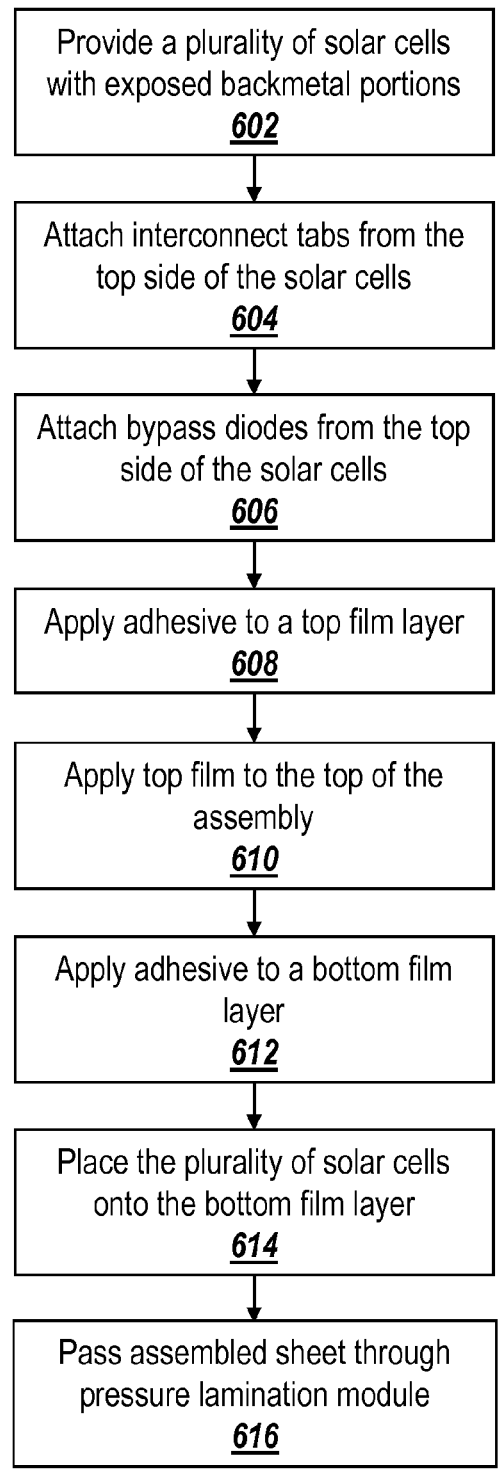
FIG. 6B is a schematic flow chart diagram depicting the sequential steps for forming an array of solar cells according to another embodiment of the present invention where a pressure sensitive adhesive is employed when forming the solar sheet.

FIG. 6B is a schematic flow chart diagram depicting the sequential steps for forming an array of solar cells when a pressure sensitive adhesive is employed when forming the solar sheet. The steps 602-614 are identical as those set forth in FIG. 6A and not need be repeated here. After the solar sheet is assembled, then the resultant sheet is passed through a lamination module (step 616) for ensuring that the solar cells within the sheet are adhered to the top and bottom sheets 352, 350. FIG. 5 is a cross-sectional view of the resultant solar sheet. The lamination module can include any time of mechanism that is suitable for applying a pressure to the assembled solar sheet so as to ensure that the components of the sheet are properly secured together. An example of a suitable mechanism is the Econocraft Laminator, manufactured by Ledco, USA. Those of ordinary skill will be able to readily determine the proper pressure to be applied to the solar sheet without damaging the sheet.

Figure 6C:
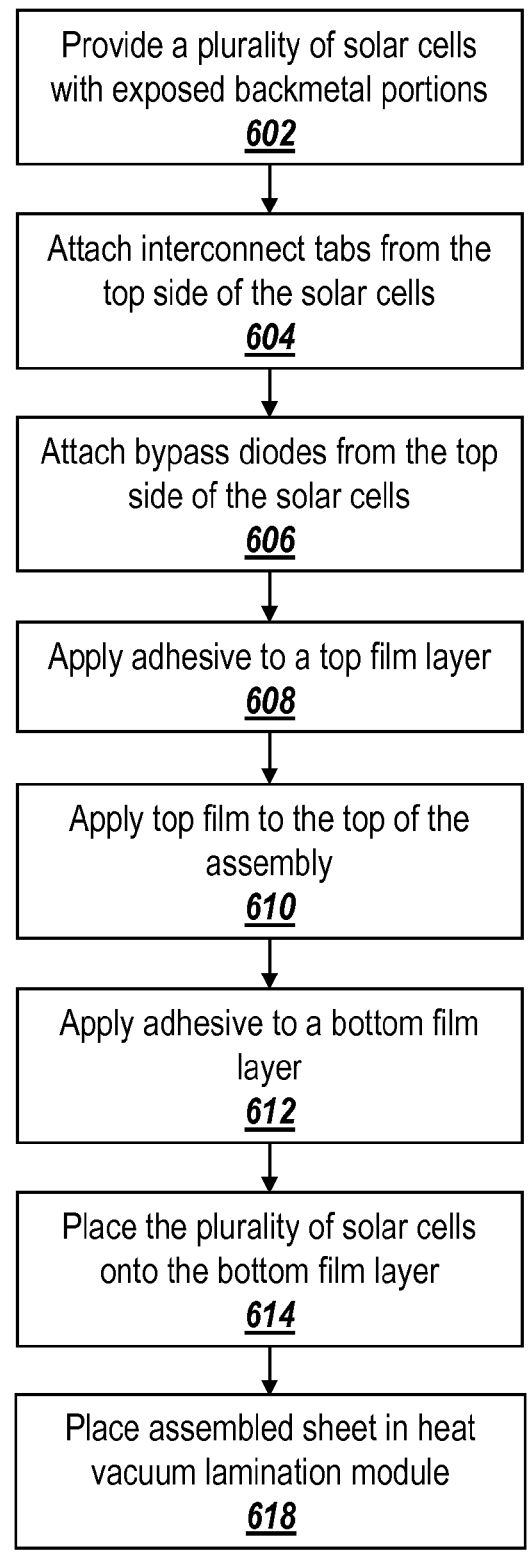
FIG. 6C is a schematic flow chart diagram depicting the sequential steps for forming an array of solar cells according to still another embodiment of the present invention where a heat sensitive adhesive is employed when forming the solar sheet.

FIG. 6C is a schematic flow chart diagram depicting the sequential steps for forming an array of solar cells when a heat sensitive adhesive is employed when forming the solar sheet. The steps 602-614 are identical as those set forth in FIG. 6A and not need be repeated here. After the solar sheet is assembled, then the resultant sheet is passed through a heat vacuum lamination module (step 618) for ensuring that the solar cells within the sheet are properly adhered to the top and bottom sheets 352, 350. The heat lamination module applies both heat and a vacuum to the solar sheet. FIG. 5 is also a cross-sectional view of the resultant solar sheet. If the heat sensitive adhesive is an EVA material, then the assembled solar sheet can be heated to a temperature within a range between about 100° C. and about 120° C., and preferably heated to a temperature of about 110° C. If the heat sensitive material is an ionomer, then the assembled solar sheet is heated to a temperature within a range between about 135° C. and about 150° C., and preferably heated to a temperature of about 140° C. Those of ordinary skill will readily understand the proper dwell time for heating the solar sheet based upon the type of adhesive used, the constructions of the solar sheet and other like parameters.

Figure 6D:
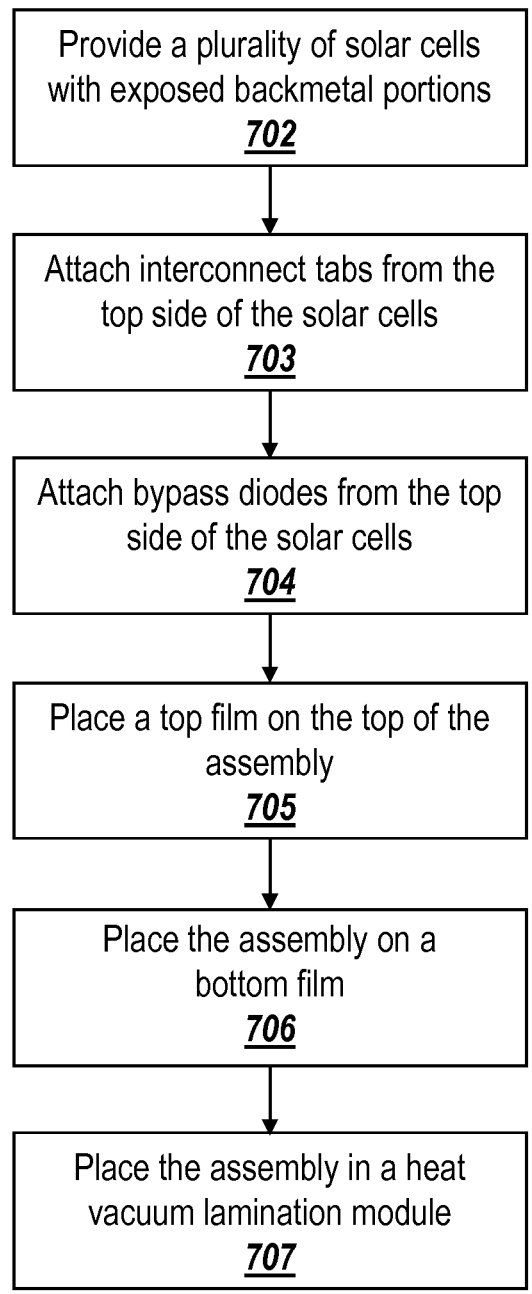
FIG. 6D is a schematic flow chart diagram depicting the sequential steps for forming an array of solar cells according to yet another embodiment of the present invention where the top and/or bottom sheets also function as the adhesive when forming the solar sheet.

FIG. 6D is a schematic flow chart diagram depicting the sequential steps for forming an array of solar cells when an ionomer heat sensitive adhesive is employed when forming the solar sheet. An advantage of using an ionomer material is that it can function as both the film layer and the adhesive. According to the current method, a plurality of inverted metamorphic solar cells with exposed backmetal portions are provided (step 702). The interconnect tabs 206 are then attached to the solar cells from the top side of the solar cells (step 703). The interconnect tabs 206 are then attached to the solar cells by welding or any other appropriate fixation method. Next, the bypass diodes are attached and/or connected to the solar cells from the top side of the solar cells (step 704). The bypass diodes can also be attached to the solar cells by welding or any other appropriate fixation method. The ionomer film is then applied as a top film layer 382, FIG. 5B, to the solar cell assembly (step 705). Likewise, the ionomer material is applied as a bottom film layer 380 to the solar cell assembly (step 706). After the solar sheet is assembled, then the resultant sheet is passed through a heat vacuum lamination module (step 707) for ensuring that the solar cells within the sheet are properly adhered to the top and bottom sheets 382, 380. FIG. 5B is also a cross-sectional view of the resultant solar sheet.

When employing an ionomer material as the heat sensitive material, then the assembled solar sheet is heated to a temperature within a range between about 135° C. and about 150° C., and preferably heated to a temperature of about 140° C. Those of ordinary skill will readily understand the proper dwell time for heating the solar sheet based upon the type of adhesive used, the constructions of the solar sheet and other like parameters.

An advantage of the assembly method of the present invention is that it allows for the forming of solar cell arrays as described herein, thus enabling fast and efficient high-volume manufacturing of the solar cell arrays, since the bonding tool only needs to access the solar cell array from one single side. This also reduces handling of the solar cell arrays, reduces the possibility of damage, which, in turn, increases the yield of solar cells from the fabrication and assembly processes.

The present invention is further illustrated by the following example, which should not be construed as further limiting.

The contents of all references, appendices, patents and published patent applications cited throughout this application are expressly incorporated herein by reference in their entirety, if not previously noted.

Example 1

Figure 7:
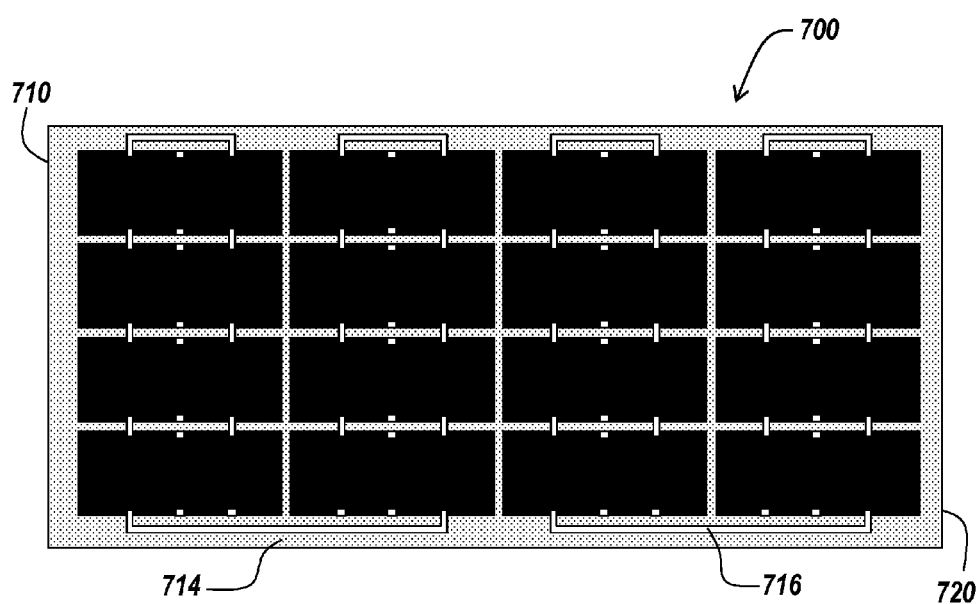
FIG. 7 is a schematic top view of an example embodiment of the present invention, which employs a 4×4 solar cell array.

A highly flexible solar cell sheet according to the teachings of the present invention is also illustrated in FIG. 7. The illustrated solar cell sheet 700 contains for example a 4×4 array of 20 cm$^2$ ELO IMM solar cells 710. The array is composed of two strings 714, 716 of eight solar cells connected in series by means of welded topside-only interconnects. After the array has been assembled, a Tedlar back sheet 720 was laminated to the bottom of the solar cell array with a pressure sensitive adhesive, such as a silicone adhesive. A Teflon top sheet film (not shown) was then applied to the top of the solar cell array with the silicone adhesive to complete the assembled solar sheet.

The completed sheet assembly generates about 9 W under direct solar illumination (approximately AM1.5) outdoors. The total weight of the sheet is about 21 g, and the total area of the sheet is about 420 cm$^2$. The specific power and areal power of the assembled solar sheet are 440 W/kg and 220 W/m$^2$, respectively.

The solar sheet is very flexible and can be repeatedly rolled and unrolled with no apparent degradation in performance.

The solar cell sheet of the present invention provides for many significant advantages. The flexibility, low weight, and high efficiency nature of the solar sheets described above allows for many applications. The following applications are envisioned among others:

In aircraft applications, the present inventors have realized that there is a need to construct aircraft that are partly or completely powered by solar energy. These aircraft may be unmanned (unmanned aerial vehicles or UAVs) or manned. These aircraft rely on solar power to operate electric motors, sensors, communications, and other avionic devices. In order to extend the operating endurance and to increase the geographic range over which such aircraft can be used, it is necessary that lightweight, high efficiency solar cells be available. Having these solar cells available in the form of sheets of the type described herein simplifies the construction of solar-powered aircraft. Lightweight, flexible solar sheets may be applied to both flat and curved surfaces of solar-powered aircraft to generate electricity.

In terrestrial application, the present inventors have realized that the military is increasingly reliant on solar energy to replace or supplement the liquid fuels and batteries that are used to provide power to operating bases and to the electrical equipment that is used in the field. The solar sheets according to the teachings of the present invention are very attractive for this application because they are lightweight and flexible, and are therefore easy to pack and carry. Small versions of the sheets can be carried by individual soldiers on backpacks or helmets, or integrated into clothing. Large versions can be mounted on vehicles or tents. Additionally, solar sheets can be applied to the surfaces of remote sensors that are currently battery operated, thereby serving as the primary energy source for these devices while concomitantly eliminating the need for personnel to visit the devices to replace batteries.

In spacecraft application, the present inventors have realized that one of the limitations on the performance of solar-powered satellites is the amount of power that can be generated by solar panels that are attached thereto. In general, the area of solar panels that can be mounted on a satellite is limited by the volume of panels that can be packed into the payload shroud of the rocket that launches the satellite. The key metric is the power per unit volume of the stowed panels at launch. For the current generation of solar panels, which is made with thick, inflexible solar cells mounted on thick carbon composite panels, the power per unit volume is relatively low. Replacing solar panels with solar sheets of the type described herein would allow a substantial increase in the power per unit volume of the stowed panels, which would allow an increase in the area of the panels, and a corresponding increase in the electrical power available to the satellite.

The present invention employs ELO IMM solar cells. Other types of cells, such as non-ELO IMM cells may also be used. The present invention employs triple-junction solar cells, but also contemplates the use of solar cells with any number of junctions, such as single-junction cells, dual-junction cells, quadruple-junction cells and cells with a larger number of junctions may be used.

The present invention employs a 4×4 array of solar cells. Those of ordinary skill will readily recognize that larger or smaller solar cell arrays can be used depending on the amount of power that is collected, the area available for the array, and the like. The current embodiment uses 20 $cm^2$ cells. Larger or smaller cells may be used depending on the size of the available cell, the area that is available for mounting the sheet, etc.

The present invention employs two strings of cells connected in parallel, each with eight elements connected in series. Those of ordinary skill will readily recognize that longer or shorter strings can be used depending on the required array output voltage. More or fewer strings may be connected in parallel depending on the required array current.

The present invention uses solar cells that permit topside-only contacts. The cells may be connected in the conventional "top-to-tail" manner, although this requires access to the backsides of cells to make backside electrical contacts.

The current embodiment uses resistance welding. Other methods of making electrical connections between cells, such as soldering, may be used instead.

The specific power of the sheet may be improved beyond the current value of 440 W/kg and the areal power density increased beyond 220 W/m by using top and back sheet films that are lighter. This may be achieved by using films that are thinner or by using films that are less dense. The specific power can also be improved by using more efficient solar cells, and by packing the cells more closely together in the solar cell array. Using the interconnection technique described herein, the spacing between cells may be made as low as 0.5 mm.

As set forth above, the solar cell sheet is suitable for terrestrial use. For space applications, it is necessary to select top sheet and back sheet materials that are robust against exposure to the atomic oxygen, ionizing radiation, and ultraviolet light found in space. For high-altitude solar-powered aircraft applications, it will be necessary to select top sheet and back sheet materials that are robust against exposure to the ultraviolet light experienced at high altitudes. For terrestrial applications, it will be necessary to select top sheet and back sheet materials that are robust against exposure to moisture and that provide an effective seal against moisture ingress that might damage the solar cells.

It may be desirable to integrate a bypass diode with the array. Electrically connecting a bypass diode across each cell makes the array robust against shading (particularly important for terrestrial applications) or failure of one or more cells.

It may be desirable to integrate a power conditioning circuit into the sheet. Such a circuit could be used to ensure that the array operates at its maximum power point, or to ensure that the array provides a suitable current output for performing a function such as charging a battery.

The physical properties of the solar cell sheet of the present invention are significantly better than conventional solar cell arrays, especially those arranged in a conventional solar sheet. Specifically, the total area of the solar sheet of the first exemplary embodiment constructed in accordance with the teachings of the present invention is about 420 $cm^2$, of which about 320 $cm^2$ is cells. The total weight of the solar sheet of the present invention is about 21 g. The total maximum power generated by the solar sheet was measured at about 9 W under outdoor illumination. The specific power of the solar sheet is about 440 W/kg. The areal power of the solar sheet is 220 $W/m^2$.

Numerous modifications and alternative embodiments of the present application will be apparent to those skilled in the art in view of the foregoing description. Accordingly, this description is to be construed as illustrative only and is for the purpose of teaching those skilled in the art the best mode for carrying out the present application. Details of the structure may vary substantially without departing from the spirit of the present application, and exclusive use of all modifications that come within the scope of the appended claims is reserved. It is intended that the present application be limited only to the extent required by the appended claims and the applicable rules of law.

It is also to be understood that the following claims are to cover all generic and specific features of the invention described herein, and all statements of the scope of the invention that, as a matter of language, might be said to fall therebetween.

We claim:

1. A method for forming a solar sheet having an array of solar cells, the method comprising the sequential steps of:
   providing a plurality of solar cells, wherein a solar cell includes a semiconductor layer formed on top of a backmetal layer leaving a portion of a top surface of the backmetal layer exposed; then next
   interconnecting the plurality of solar cells using one or more interconnect tabs by coupling the exposed top surface of the backmetal layer of a first solar cell to a top surface of an adjacent second solar cell; then next
   attaching the one or more interconnect tabs to the top side of the solar cell to interconnect the plurality of solar cells by coupling the exposed top surface of the backmetal layer of a first solar cell to a top surface of an adjacent second solar cell;
   attaching one or more bypass diodes to a top side of the solar cell to form the array of solar cells; then next
   applying an adhesive to a first film layer that is separate and distinct from the array of solar cells;
   placing the array of solar cells onto the first film layer; then next
   applying an adhesive to a second film layer that is separate and distinct from the array of solar cells;
   placing the array of solar cells and the first film layer onto the second film layer to form a sheet assembly, and then forming the solar sheet from the sheet assembly.

2. The method of claim 1, wherein the adhesive comprises a pressure sensitive adhesive.

3. The method of claim 2 wherein the adhesive comprises a silicon based material.

4. The method of claim 3, wherein the step of forming further comprises placing the sheet assembly in a pressure lamination module to form the solar sheet.

5. The method of claim 1, wherein the adhesive comprises a heat sensitive adhesive.

6. The method of claim 5, wherein the heat sensitive adhesive comprises a ethylene vinyl acetate material.

7. The method of claim 5, wherein the step of forming further comprises placing the sheet assembly in a heat vacuum lamination module to form the solar sheet.

8. A method for forming a solar sheet having an array of solar cells, the method comprising the sequential steps of:

providing a plurality of solar cells, wherein a solar cell includes a semiconductor layer formed on top of a backmetal layer leaving a portion of a top surface of the backmetal layer exposed; then next interconnecting the plurality of solar cells using one or more interconnect tabs by coupling the exposed top surface of the backmetal layer of a first solar cell to a top surface of an adjacent second solar cell; then next attaching the one or more interconnect tabs to the top side of the solar cell to interconnect the plurality of solar cells by coupling the exposed top surface of the backmetal layer of a first solar cell to a top surface of an adjacent second solar cell;

attaching one or more bypass diodes to a top side of the solar cell to form the array of solar cells; then next applying a first film layer that is free a separate adhesive layer to the array of solar cells; then next applying a second film layer that is separate and distinct from the array of solar cells and free of a separate adhesive layer to form a sheet assembly; and then forming the solar sheet from the sheet assembly.

9. The method of claim 8, wherein at least the first film layer is formed from a heat sensitive adhesive.

10. The method of claim 9, wherein the heat sensitive adhesive comprises an ionomer material.

11. The method of claim 10, wherein the step of forming further comprises placing the sheet assembly in a heat vacuum lamination module to form the solar sheet.

* * * * *

UNITED STATES PATENT AND TRADEMARK OFFICE
CERTIFICATE OF CORRECTION

PATENT NO. : 8,993,366 B2  Page 1 of 1
APPLICATION NO. : 13/931463
DATED : March 31, 2015
INVENTOR(S) : Raymond Chan et al.

It is certified that error appears in the above-identified patent and that said Letters Patent is hereby corrected as shown below:

In the Specification

At column 1, line number 4, after the title, please insert the following heading and paragraph:

--GOVERNMENT INTEREST

This invention was made with Government support under FA9453-09-C-0365 awarded by the Air Force Research Laboratory. The Government has certain rights in the invention.--

Signed and Sealed this
Seventeenth Day of November, 2015

Michelle K. Lee
*Director of the United States Patent and Trademark Office*